(12) United States Patent
Chen

(10) Patent No.: US 11,832,409 B2
(45) Date of Patent: Nov. 28, 2023

(54) EJECTING MECHANISM AND DETACHABLE DEVICE WITH THE AFOREMENTIONED EJECTING MECHANISM

(71) Applicant: Moxa Inc., New Taipei (TW)

(72) Inventor: Wei-Ming Chen, New Taipei (TW)

(73) Assignee: Moxa Inc., New Taipei (TW)

( * ) Notice: Subject to any disclaimer, the term of this patent is extended or adjusted under 35 U.S.C. 154(b) by 0 days.

(21) Appl. No.: 17/683,238

(22) Filed: Feb. 28, 2022

(65) Prior Publication Data

US 2023/0209753 A1 Jun. 29, 2023

(30) Foreign Application Priority Data

Dec. 28, 2021 (TW) ................................. 110149052

(51) Int. Cl.
*H05K 5/02* (2006.01)
(52) U.S. Cl.
CPC ................................. *H05K 5/0295* (2013.01)
(58) Field of Classification Search
CPC ....................................................... H05K 7/00
See application file for complete search history.

(56) References Cited

U.S. PATENT DOCUMENTS

| 2009/0042410 | A1 | 2/2009 | Ujii | |
|---|---|---|---|---|
| 2011/0095153 | A1* | 4/2011 | Zhang | G11B 33/124 248/309.1 |
| 2011/0182006 | A1* | 7/2011 | Liao | H05K 7/1411 361/679.01 |

FOREIGN PATENT DOCUMENTS

| CN | 201418223 Y | 3/2010 |
|---|---|---|
| TW | I625087 B | 5/2018 |
| TW | I715430 B | 1/2021 |

\* cited by examiner

*Primary Examiner* — Jerry Wu
(74) *Attorney, Agent, or Firm* — Winston Hsu

(57) ABSTRACT

An ejecting mechanism is provided and includes a main body, a driving component and a driven component. The main body is slidable relative to a casing. The driving component and the driven component are pivotable relative to the main body. When the driving component switches from a first position to a second position, the driving component drives the driven component to switch from a third position to a fourth position. During a process that the driving component and the driven component respectively switch from the first position and the third position to the second position and the fourth position, the driving component and the driven component respectively push two opposite lateral walls of the casing to drive the main body to slide from an installation position to a detachment position relative to the casing. Furthermore, an electronic device with the aforementioned ejecting mechanism is provided.

21 Claims, 10 Drawing Sheets

EJECTING MECHANISM AND DETACHABLE DEVICE WITH THE AFOREMENTIONED EJECTING MECHANISM

BACKGROUND OF THE INVENTION

1. Field of the Invention

The present invention relates to an ejecting mechanism for a detachable module and a detachable device with the aforementioned ejecting mechanism, and more specifically, to an ejecting mechanism which is labor-saving and force-balancing and has simple structure and easy operation, and a detachable device with the aforementioned ejecting mechanism.

2. Description of the Prior Art

In order to satisfy different requirements in different application fields, modularity has gradually become a mainstream trend of electronic devices. Currently, a modular electronic device usually includes a casing and at least one detachable module installed on the casing. For example, a detachable hard disk drive is one of the common detachable modules. A detachable module is usually equipped with a handle for a user to grab. When it is desired to withdraw or detach such detachable module, the user can grab the handle to pull the detachable module by overcoming a mating force between an electrical connector of the detachable module and a corresponding electrical connector of a circuit board. However, it is not easy to withdraw or detach the detachable module due to the large mating force between the two electrical connectors. Furthermore, there is another modular electronic device equipped with an ejecting mechanism. The ejecting mechanism is used to eject the detachable module for easy detachment of the detachable module. However, the conventional ejecting mechanism has complicated structure and affects an outward appearance and an internal space arrangement, which causes negative influences on the overall aesthetic appearance and miniaturization and thinning design of the electronic device. Therefore, there is a need to provide an improved mechanism and a related device.

SUMMARY OF THE INVENTION

Therefore, it is an objective of the present invention to provide an ejecting mechanism which is labor-saving and force-balancing and has simple structure and easy operation, and a detachable device with the aforementioned ejecting mechanism for solving the aforementioned problem.

In order to achieve the aforementioned objective, the present invention discloses an ejecting mechanism for a detachable module. The ejecting mechanism includes a main body, a driving component and a driven component. The main body is slidably installed on a casing. The main body is slidably switchable between an installation position and a detachment position relative to the casing. The casing includes a first lateral wall and a second lateral wall opposite to the first lateral wall. The main body includes a first side and a second side opposite to the first side. The first side and the second side of the main body are respectively adjacent to the first lateral wall and the second lateral wall of the casing. The driving component is pivotally connected to the main body and located at the first side of the main body. The driving component is pivotally switchable between a first position and a second position relative to the main body. The driven component is pivotally connected to the main body and located at the second side of the main body. The driven component is pivotally switchable between a third position and a fourth position relative to the main body. The driving component drives the driven component to switch from the third position to the fourth position when the driving component switches from the first position to the second position, and the driving component and the driven component respectively push the first lateral wall and the second lateral wall of the casing for driving the main body to slide from the installation position to the detachment position during a process that the driving component and the driven component respectively switch from the first position and the third position to the second position and the fourth position.

According to an embodiment of the present invention, the driving component includes a driving portion. The driven component includes a driven portion. The driving portion is configured to cooperate with the driven portion, and the driving component drives the driven component to switch from the third position to the fourth position by a cooperation of the driving portion and the driven portion when the driving component switches from the first position to the second position.

According to an embodiment of the present invention, the driving component further includes a first pushing portion. The driven component further includes a second pushing portion, and the first pushing portion and the second pushing portion respectively push the first lateral wall and the second lateral wall of the casing for driving the main body to slide from the installation position to the detachment position along a first sliding direction during the process that the driving component and the driven component respectively switch from the first position and the third position to the second position and the fourth position.

According to an embodiment of the present invention, the first pushing portion and the second pushing portion respectively abut against the first lateral wall and the second lateral wall of the casing to restrain the main body from slidably leaving from the installation position relative to the casing along a second sliding direction opposite to the first sliding direction when the driving component and the driven component are respectively located at the first position and the third position.

According to an embodiment of the present invention, the driving component further includes a first stopping portion. The driven component further includes a second stopping portion, and the first stopping portion and the second stopping portion respectively engage with the first lateral wall and the second lateral wall of the casing to restrain the main body from sliding from the installation position to the detachment position relative to the casing when the driving component and the driven component are respectively located at the first position and the third position.

According to an embodiment of the present invention, the driving component includes a first stopping portion. The driven component includes a second stopping portion, and the first stopping portion and the second stopping portion respectively engage with the first lateral wall and the second lateral wall of the casing to restrain the main body from sliding from the installation position to the detachment position relative to the casing when the driving component and the driven component are respectively located at the first position and the third position.

According to an embodiment of the present invention, the first lateral wall and the second lateral wall of the casing respectively push the driving component and the driven component for driving the driving component and the driven component to respectively switch from the second position and the fourth position to the first position and the third position during a process that the main body slides from the detachment position to the installation position relative to the casing.

According to an embodiment of the present invention, the driving component includes a first pushing portion and a first stopping portion. The driven component includes a second pushing portion and a second stopping portion, and the first lateral wall and the second lateral wall of the casing respectively push the first pushing portion and the second pushing portion for driving the driving component and the driven component to respectively switch from the second position and the fourth position to the first position and the third position to drive the first stopping portion and the second stopping portion to respectively engage with the first lateral wall and the second lateral wall during the process that the main body slides from the detachment position to the installation position relative to the casing.

According to an embodiment of the present invention, the ejecting mechanism further includes a resilient component disposed between the driving component and the main body for driving the main body to switch to the second position.

According to an embodiment of the present invention, the ejecting mechanism further includes an operating component exposed out of the main body and connected to the driving component, and the operating component driving the driving component to switch from the first position to the second position when the operating component is operated.

According to an embodiment of the present invention, the driving component further includes a first pushing portion, and a moment arm of the operating component relative to a pivoting axis of the driving component is greater than a moment arm of the first pushing portion relative to the pivoting axis of the driving component.

In order to achieve the aforementioned objective, the present invention further discloses a detachable device. The detachable device includes a casing, a detachable module and at least one ejecting mechanism. The casing includes at least one first lateral wall and at least one second lateral wall opposite to the at least one first lateral wall. The at least one ejecting mechanism includes a main body, a driving component and a driven component. The main body is disposed on the detachable module and slidably installed on the casing. The main body is slidably switchable between an installation position and a detachment position relative to the casing. The main body includes a first side and a second side opposite to the first side. The first side and the second side of the main body are respectively adjacent to the at least one first lateral wall and the at least one second lateral wall of the casing. The driving component is pivotally connected to the main body and located at the first side of the main body. The driving component is pivotally switchable between a first position and a second position relative to the main body. The driven component is pivotally connected to the main body and located at the second side of the main body. The driven component is pivotally switchable between a third position and a fourth position relative to the main body. The driving component drives the driven component to switch from the third position to the fourth position when the driving component switches from the first position to the second position, and the driving component and the driven component respectively push the at least one first lateral wall and the at least one second lateral wall of the casing for driving the main body to slide from the installation position to the detachment position during a process that the driving component and the driven component respectively switch from the first position and the third position to the second position and the fourth position.

According to an embodiment of the present invention, the driving component includes a driving portion. The driven component includes a driven portion. The driving portion is configured to cooperate with the driven portion, and the driving component drives the driven component to switch from the third position to the fourth position by a cooperation of the driving portion and the driven portion when the driving component switches from the first position to the second position.

According to an embodiment of the present invention, the driving component further includes a first pushing portion. The driven component further includes a second pushing portion, and the first pushing portion and the second pushing portion to respectively push the at least one first lateral wall and the at least one second lateral wall of the casing for driving the main body to slide from the installation position to the detachment position along a first sliding direction during the process that the driving component and the driven component respectively switch from the first position and the third position to the second position and the fourth position.

According to an embodiment of the present invention, the first pushing portion and the second pushing portion respectively abut against the at least one first lateral wall and the at least one second lateral wall of the casing to restrain the main body from slidably leaving from the installation position relative to the casing along a second sliding direction opposite to the first sliding direction when the driving component and the driven component are respectively located at the first position and the third position.

According to an embodiment of the present invention, the driving component further includes a first stopping portion. The driven component further includes a second stopping portion, and the first stopping portion and the second stopping portion respectively engage with the at least one first lateral wall and the at least one second lateral wall of the casing to restrain the main body from sliding from the installation position to the detachment position relative to the casing when the driving component and the driven component are respectively located at the first position and the third position.

According to an embodiment of the present invention, the driving component includes a first stopping portion. The driven component includes a second stopping portion, and the first stopping portion and the second stopping portion respectively engage with the at least one first lateral wall and the at least one second lateral wall of the casing to restrain the main body from sliding from the installation position to the detachment position relative to the casing when the driving component and the driven component are respectively located at the first position and the third position.

According to an embodiment of the present invention, the at least one first lateral wall and the at least one second lateral wall of the casing respectively push the driving component and the driven component for driving the driving component and the driven component to respectively switch from the second position and the fourth position to the first position and the third position during a process that the main body slides from the detachment position to the installation position relative to the casing.

According to an embodiment of the present invention, the driving component includes a first pushing portion and a first stopping portion. The driven component includes a second pushing portion and a second stopping portion, and the at least one first lateral wall and the at least one second lateral wall of the casing respectively push the first pushing portion and the second pushing portion for driving the driving component and the driven component to respectively switch from the second position and the fourth position to the first position and the third position to drive the first stopping portion and the second stopping portion to respectively engage with the at least one first lateral wall and the at least one second lateral wall during the process that the main body slides from the detachment position to the installation position relative to the casing.

According to an embodiment of the present invention, a first pushing structure and a first engaging structure are formed on the at least one first lateral wall. A second pushing structure and a second engaging structure are formed on the at least one second lateral wall, and the first pushing structure and the second pushing structure respectively push the first pushing portion and the second pushing portion for driving the driving component and the driven component to respectively switch from the second position and the fourth position to the first position and the third position to drive the first stopping portion and the second stopping portion to respectively engage with the first engaging structure and the second engaging structure during the process that the main body slides from the detachment position to the installation position relative to the casing.

According to an embodiment of the present invention, the ejecting mechanism further includes a resilient component disposed between the driving component and the main body for driving the main body to switch to the second position.

According to an embodiment of the present invention, the ejecting mechanism further includes an operating component exposed out of the main body and connected to the driving component, and the operating component driving the driving component to switch from the first position to the second position when the operating component is operated.

According to an embodiment of the present invention, the driving component further includes a first pushing portion, and a moment arm of the operating component relative to a pivoting axis of the driving component is greater than a moment arm of the first pushing portion relative to the pivoting axis of the driving component.

In summary, in the present invention, since the moment arm of the operating component relative to the pivoting axis of the driving component is greater than the moment arm of the first pushing portion relative to the pivoting axis of the driving component, the ejecting mechanism has labor-saving operation. Furthermore, in the present invention, since the ejecting mechanism pushes the first lateral wall and the second lateral wall of the casing respectively by the driving component and the driven component movably linked to each other for driving the main body to slide from the installation position to the detachment position, the ejecting mechanism can apply balanced forces on the casing, which prevents an electrical connector of the detachable module or an electrical connector of a circuit board from being damaged due to unbalanced forces when the detachable device is an electronic device. Besides, the present invention has simple structure and easy operation.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
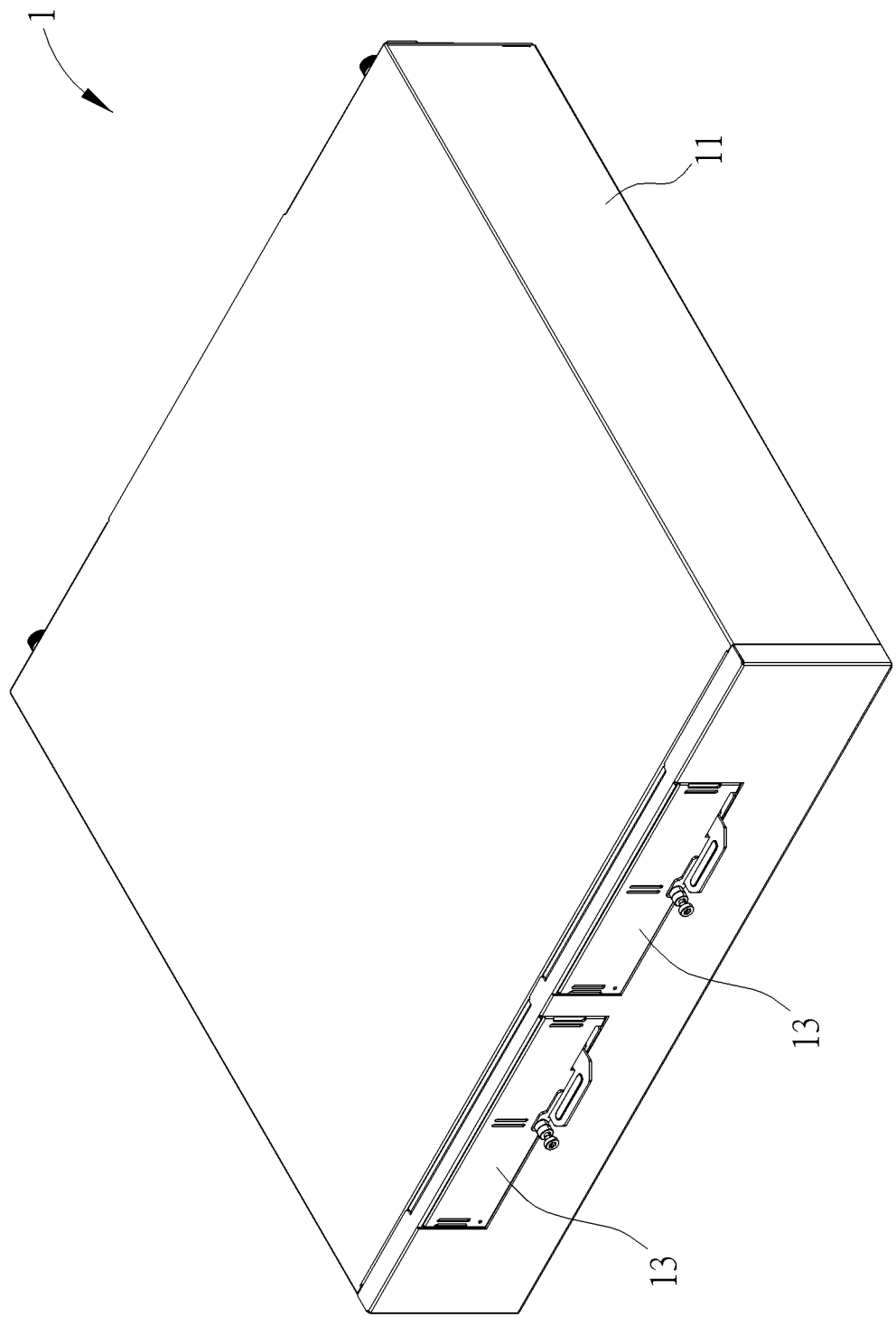
FIG. 1 is a schematic diagram of a detachable device according to an embodiment of the present invention.
Figure 2:
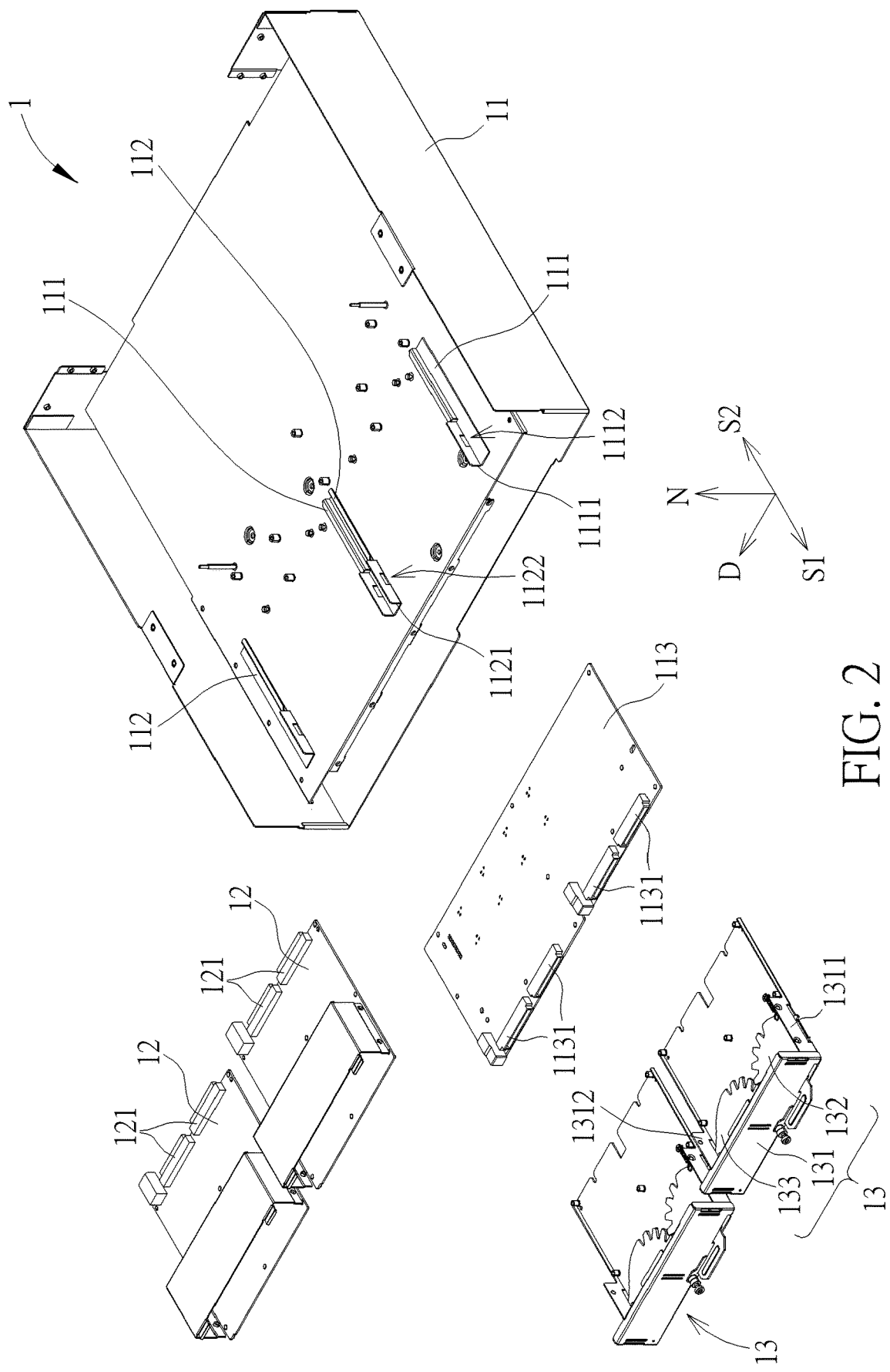
FIG. 2 is a partial exploded diagram of the detachable device according to the embodiment of the present invention.
Figure 3:
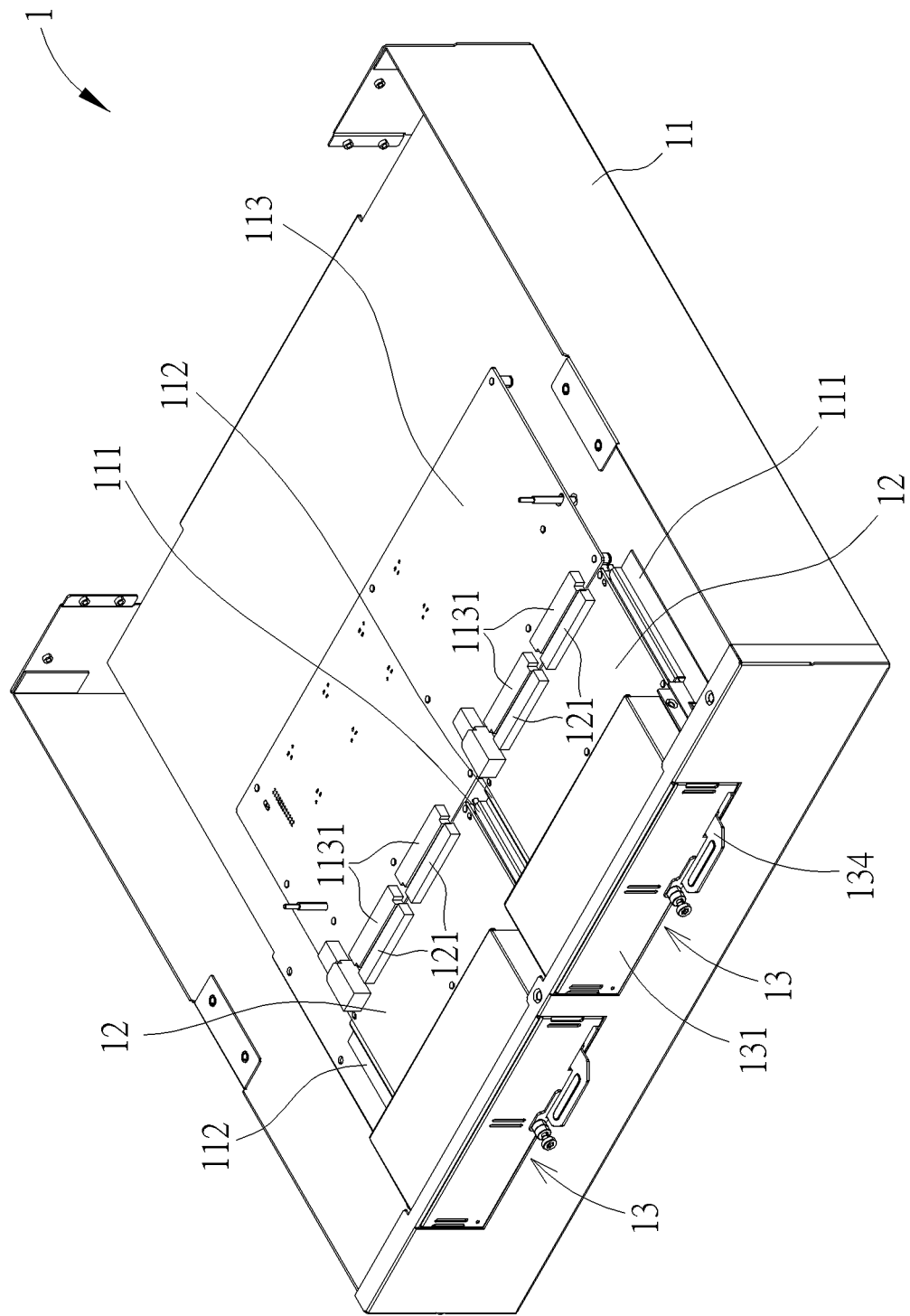
FIG. 3 and FIG. 4 are partial diagrams of the detachable device in a first state and a second state according to the embodiment of the present invention.
Figure 4:
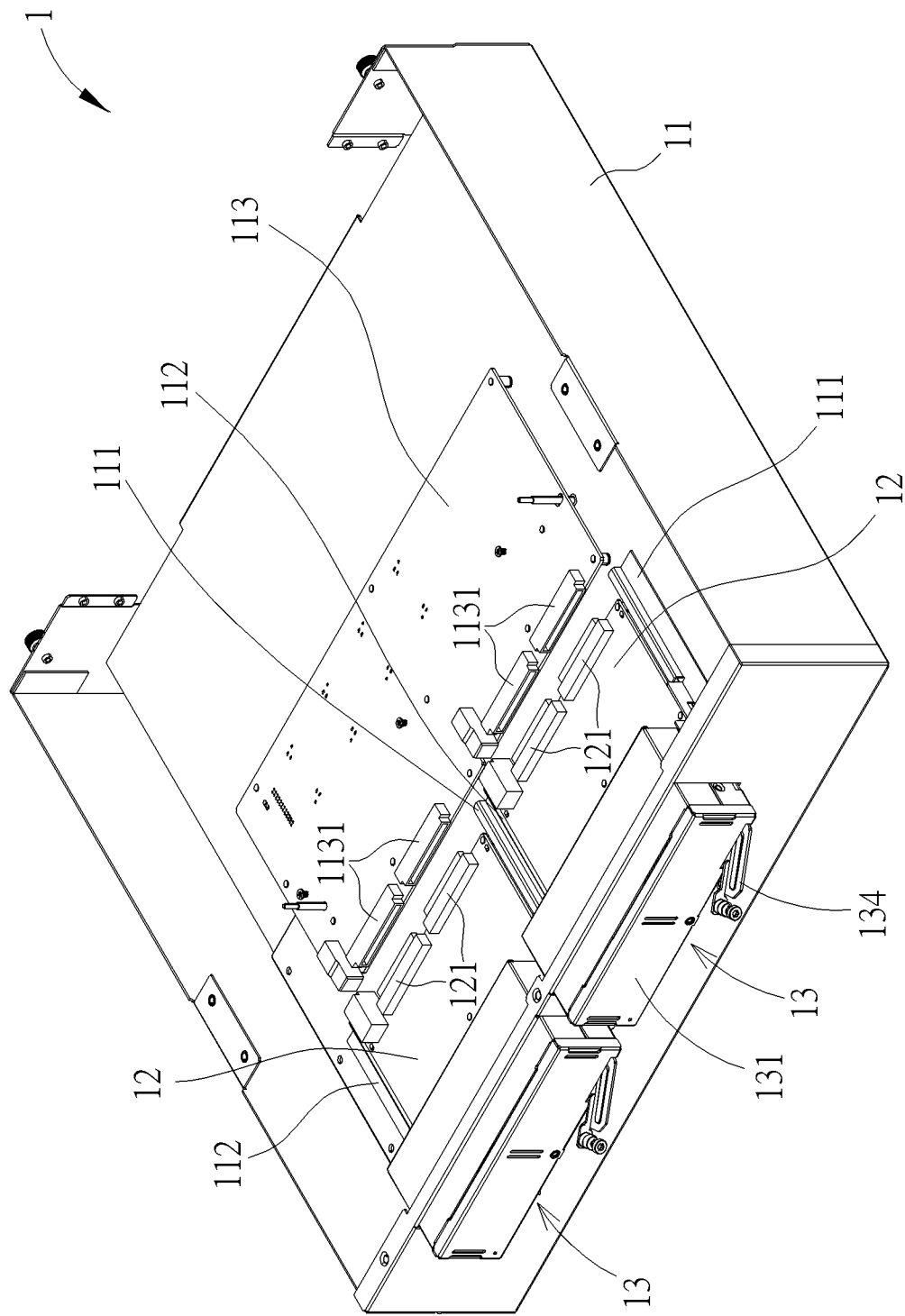

Please refer to FIG. 1 to FIG. 4. FIG. 1 is a schematic diagram of a detachable device 1 according to an embodiment of the present invention. FIG. 2 is a partial exploded diagram of the detachable device 1 according to the embodiment of the present invention. FIG. 3 and FIG. 4 are partial diagrams of the detachable device 1 in a first state and a second state according to the embodiment of the present invention. As shown in FIG. 1 to FIG. 4, the detachable device 1 includes a casing 11, two detachable modules 12 and two ejecting mechanisms 13. The casing 11 includes two first lateral walls 111 and two second lateral walls 112 respectively opposite to the two first lateral walls 111. Each of the ejecting mechanisms 13 is configured to cooperate with the corresponding first lateral wall 111 and the corresponding second lateral wall 112 for ejecting the corresponding detachable module 12 from the casing 11.

In this embodiment, the detachable device 1 can be an electronic device, such as an industrial computer, a network host or a server cabinet, and the detachable module 12 can be a detachable hard disk drive or a detachable wireless communication module. However the present invention is not limited to this embodiment.

Besides, the numbers of the detachable module and the ejecting mechanism are not limited to this embodiment. For example, in another embodiment, the detachable device can include one ejecting mechanism and one detachable module only, and the casing can include one first lateral wall and one second lateral wall only.

The two ejecting mechanisms 13 have identical structures and operational principles. Detailed description for one of the ejecting mechanisms 13 together with the corresponding first lateral wall 111, the corresponding second lateral wall 112 and the corresponding detachable module 12 is introduced as follows.

The ejecting mechanism 13 includes a main body 131, a driving component 132 and a driven component 133. The main body 131 is disposed on the detachable module 12 and slidably installed on the casing 11. The main body 131 is slidably switchable between an installation position as shown in FIG. 3 and a detachment position as shown in FIG. 4 relative to the casing 11. A circuit board 113 can be disposed on the casing 11. At least one electrical connector 121 of the detachable module 12 is connected to at least one electrical connector 1131 of the circuit board 113 when the main body 131 is located at the installation position as shown in FIG. 3. When the main body 131 is located at the detachment position as shown in FIG. 4, the electrical connector 121 of the detachable module 12 is separated from the electrical connector 1131 of the circuit board 113, i.e., the electrical connector 121 of the detachable module 12 is disconnected from the electrical connector disposed on the circuit board 113, for allowing easy detachment or easy withdrawal of the ejecting mechanism 13 and the detachable module 12 together from the casing 11 for facilitating following maintenance or replacement work.

Figure 5:
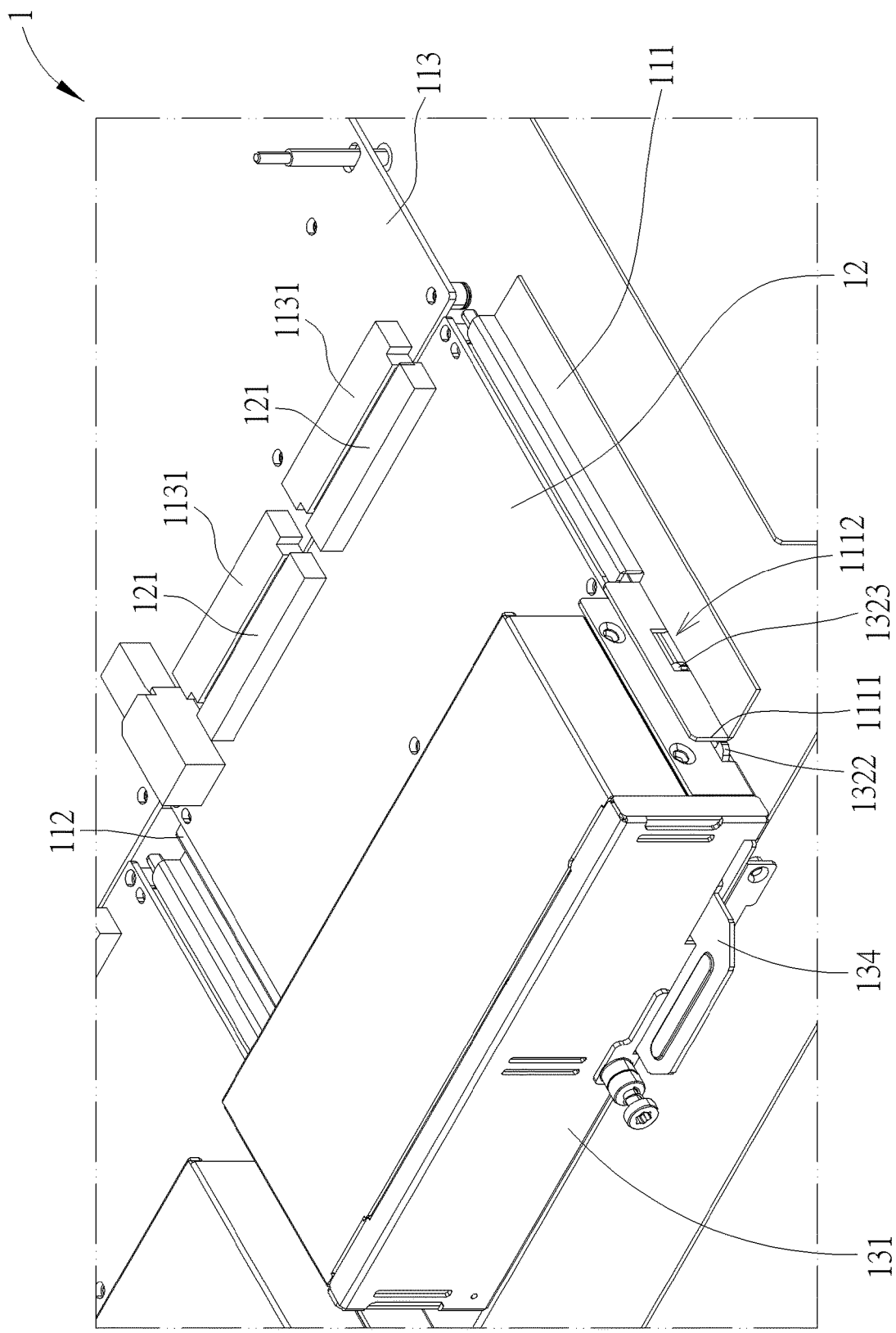
FIG. 5 is a partial enlarged diagram of the detachable device in the first state according to the embodiment of the present invention.
Figure 6:
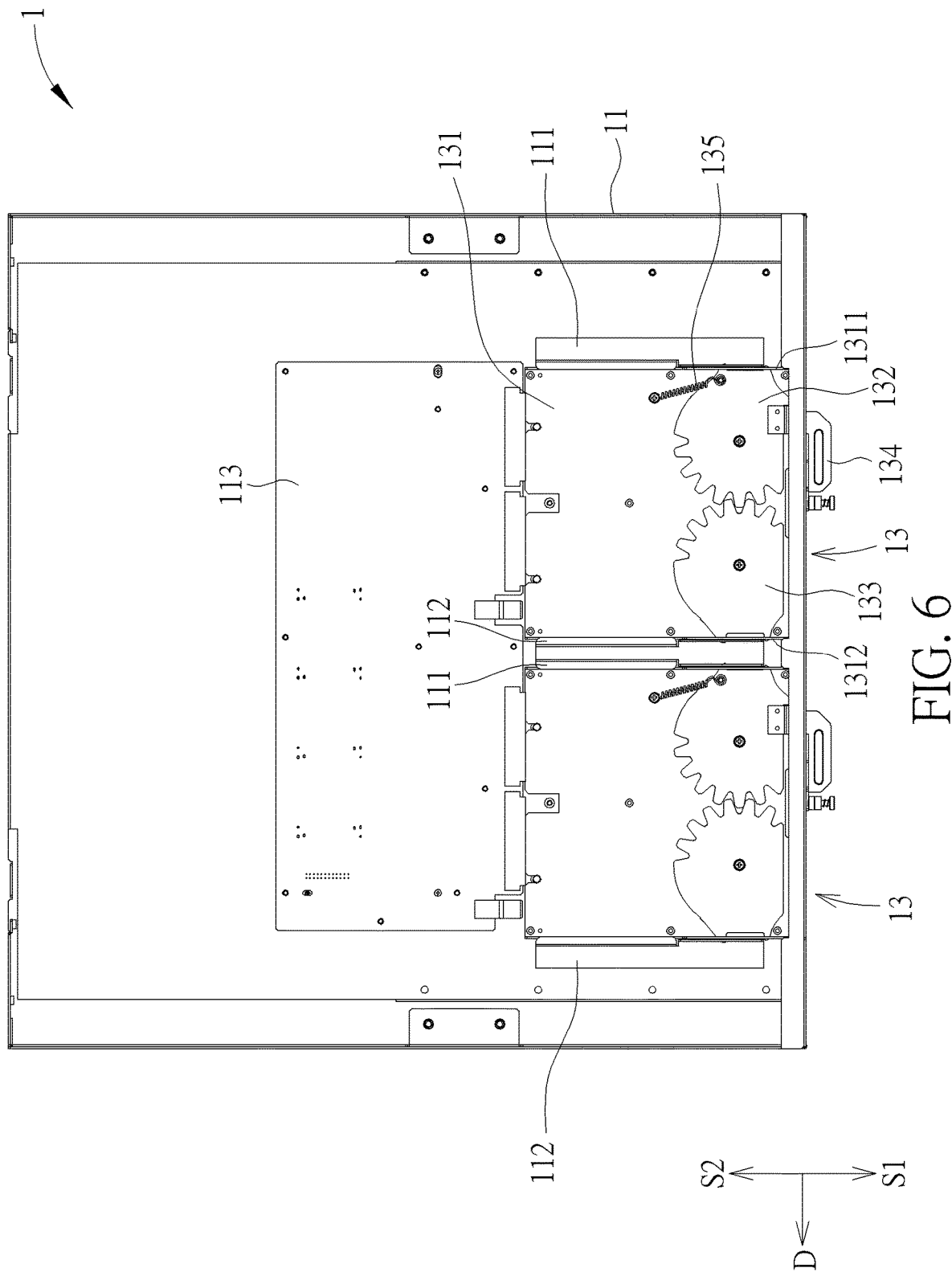
FIG. 6 is a top view diagram of the detachable device in the first state according to the embodiment of the present invention.
Figure 7:
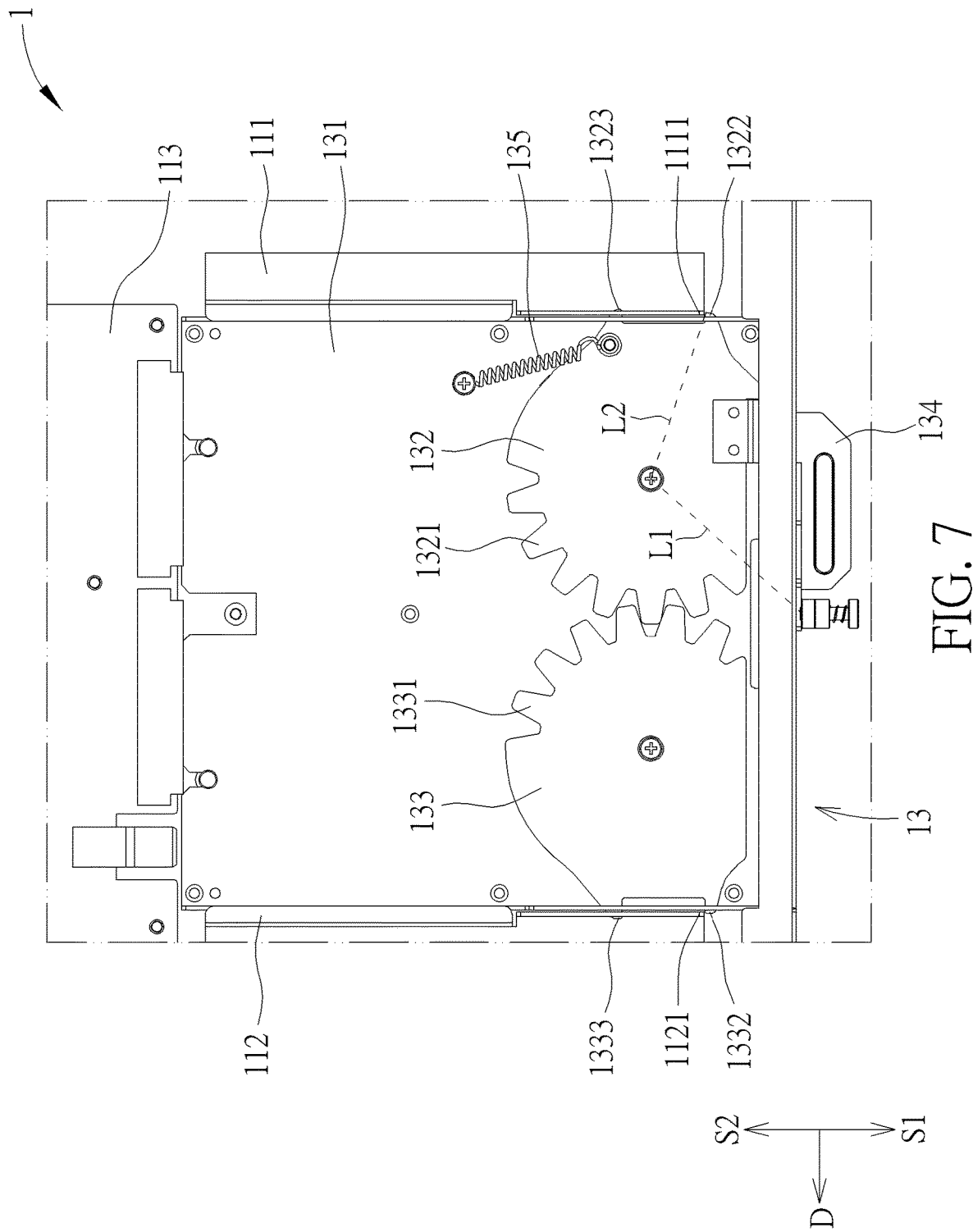
FIG. 7 is a partial enlarged diagram of the detachable device shown in FIG. 6 according to the embodiment of the present invention.
Figure 8:
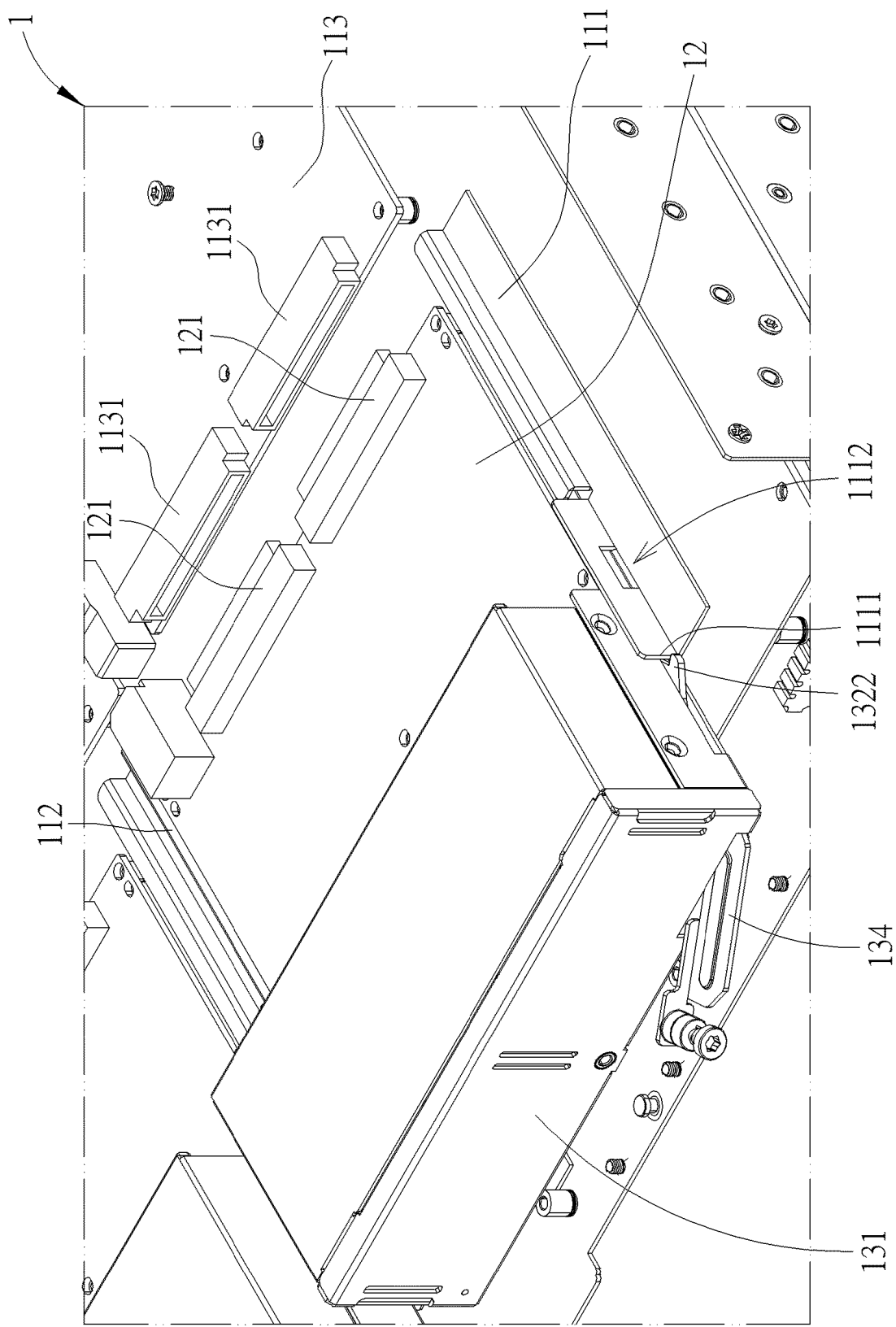
FIG. 8 is a partial enlarged diagram of the detachable device in the second state according to the embodiment of the present invention.
Figure 9:
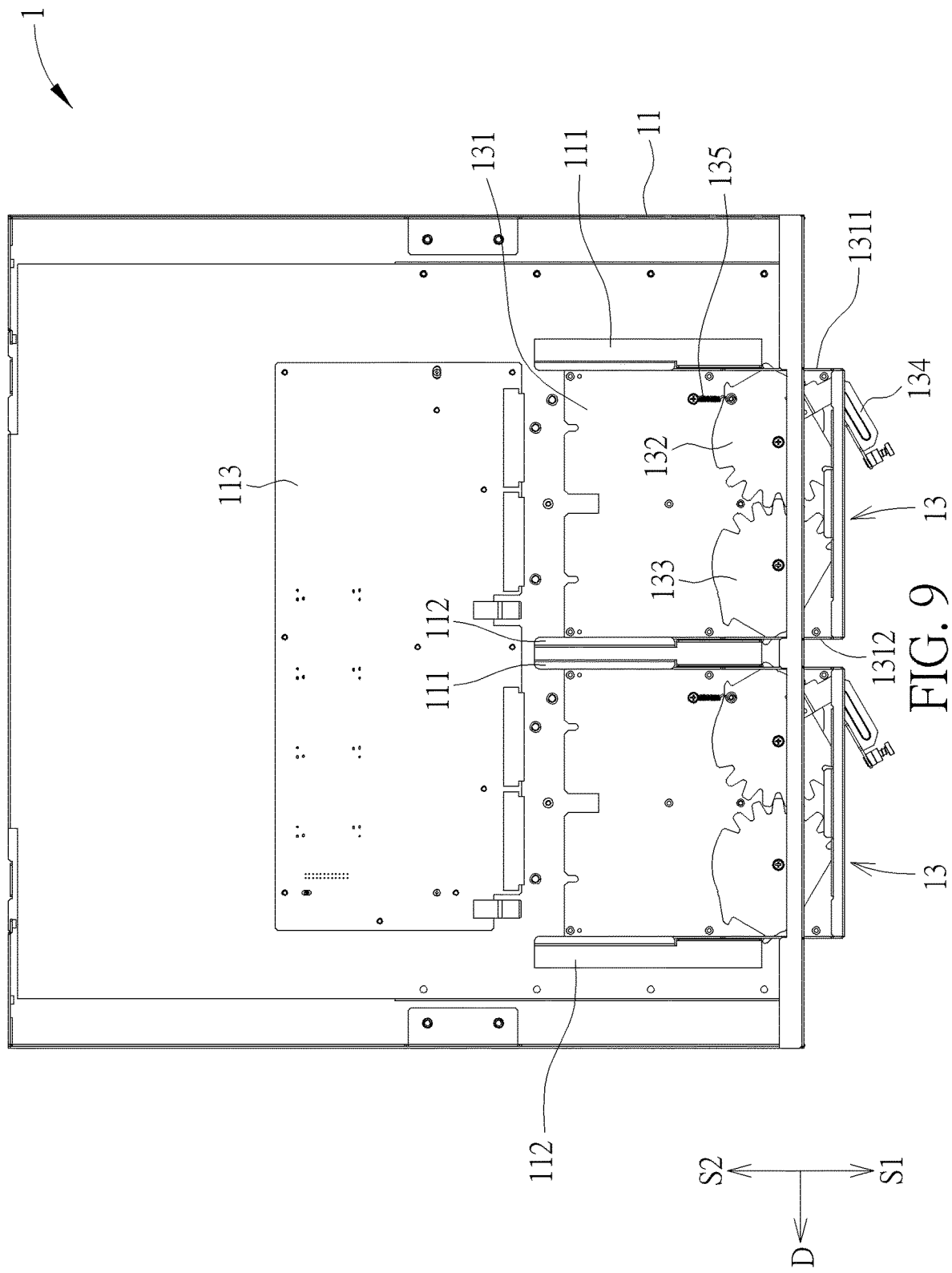
FIG. 9 is a top view diagram of the detachable device in the second state according to the embodiment of the present invention.
Figure 10:
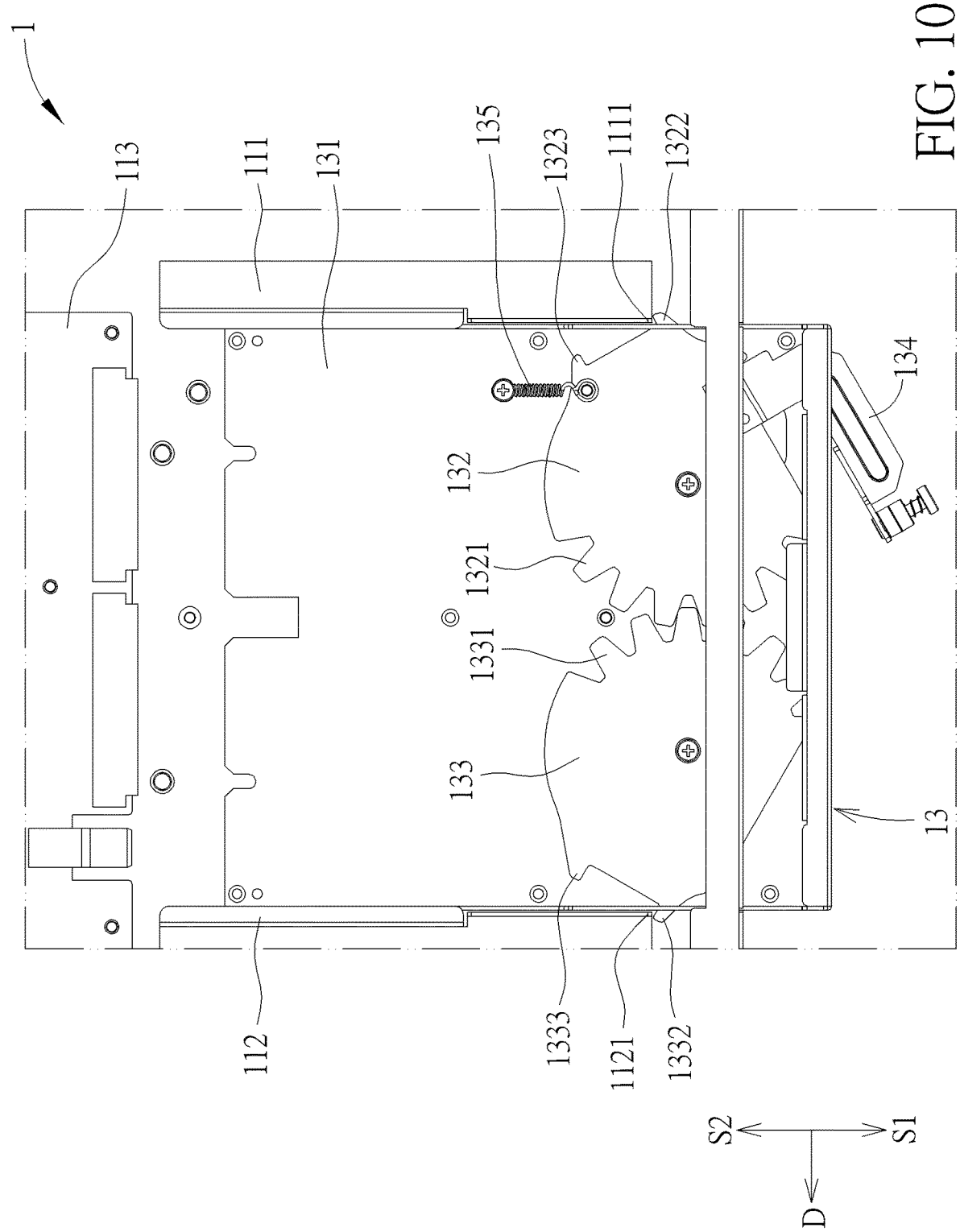
FIG. 10 is a partial enlarged diagram of the detachable device shown in FIG. 9 according to the embodiment of the present invention.

Specifically, please refer to FIG. 2 and FIG. 5 to FIG. 10. FIG. 5 is a partial enlarged diagram of the detachable device 1 in the first state according to the embodiment of the present invention. FIG. 6 is a top view diagram of the detachable device 1 in the first state according to the embodiment of the present invention. FIG. 7 is a partial enlarged diagram of the detachable device 1 shown in FIG. 6 according to the embodiment of the present invention. FIG. 8 is a partial enlarged diagram of the detachable device 1 in the second state according to the embodiment of the present invention. FIG. 9 is a top view diagram of the detachable device 1 in the second state according to the embodiment of the present invention. FIG. 10 is a partial enlarged diagram of the detachable device 1 shown in FIG. 9 according to the embodiment of the present invention. A shown in FIG. 2 and FIG. 5 to FIG. 10, the main body 131 includes a first side 1311 and a second side 1312 opposite to the first side 1311. The first side 1311 and the second side 1312 are respectively adjacent to the first lateral wall 111 and the second lateral wall 112. The driving component 132 is pivotally connected to the main body 131 and located at the first side 1311 of the main body 131. The driving component 132 is pivotally switchable between a first position as shown in FIG. 5 to FIG. 7 and a second position as shown in FIG. 8 to FIG. 10 relative to the main body 131. The driven component 133 is pivotally connected to the main body 131 and located at the second side 1312 of the main body 131. The driven component 133 is pivotally switchable between a third position as shown in FIG. 5 to FIG. 7 and a fourth position as shown in FIG. 8 to FIG. 10 relative to the main body 131. The driving component 132 drives the driven component 133 to switch from the third position to the fourth position when the driving component 132 switches from the first position to the second position. During a process that the driving component 132 and the driven component 133 respectively switch from the first position and the third position to the second position and the fourth position, the driving component 132 and the driven component 133 respectively push the first lateral wall 111 and the second lateral wall 112 for driving the main body 131 to slide from the installation position as shown in FIG. 3 and FIG. 5 to the detachment position as shown in FIG. 4 and FIG. 8, so as to separate the electrical connector 121 of the detachable module 12 from the electrical connector 1131 of the circuit board 113 for allowing the easy detachment or the easy withdrawal of the ejecting mechanism 13 and the detachable module 12 together from the casing 11 for facilitating the following maintenance or replacement work. Furthermore, since the ejecting mechanism 13 pushes the first lateral wall 111 and the second lateral wall 112 respectively by the driving component 132 and the driven component 133 for driving the main body 131 to slide from the installation position to the detachment position, the ejecting mechanism 13 applies balanced forces on the casing 11, which prevents the electrical connector 121 of the detachable module 12 or the electrical connector 1131 of the circuit board 113 from being damaged due to unbalanced forces.

More specifically, the driving component 132 includes a driving portion 1321, a first pushing portion 1322 and a first stopping portion 1323. The driven component 133 includes a driven portion 1331, a second pushing portion 1332 and a second stopping portion 1333. The driving portion 1321 is configured to cooperate with the driven portion 1331. The driving component 132 drives the driven component 133 to switch from the third position to the fourth position by a cooperation of the driving portion 1321 and the driven portion 1331 when the driving component 132 switches from the first position to the second position. During the process that the driving component 132 and the driven component 133 respectively switch from the first position and the third position to the second position and the fourth position, the first pushing portion 1322 and the second pushing portion 1332 respectively push the first lateral wall 111 and the second lateral wall 112 for driving the main body 131 to slide from the installation position to the detachment position along a first sliding direction S1.

Furthermore, a first pushing structure 1111 and a first engaging structure 1112 are formed on the first lateral wall 111. A second pushing structure 1121 and a second engaging structure 1122 are formed on the second lateral wall 112. During the process that the driving component 132 and the driven component 133 respectively switch from the first position and the third position to the second position and the fourth position, the first pushing portion 1322 and the second pushing portion 1332 respectively push the first pushing structure 1111 and the second pushing structure 1121 for driving the main body 131 to slide from the installation position to the detachment position along the first sliding direction S1. During a process that the main body 131 slides from the detachment position to the installation position relative to the casing 11 along a second sliding direction S2 opposite to the first sliding direction S1, the first pushing structure 1111 and the second pushing structure 1121 respectively push the first pushing portion 1322 and the second pushing portion 1332 for driving the driving component 132 and the driven component 133 to respectively switch from the second position and the fourth position to the first position and the third position, so as to drive the first stopping portion 1323 and the second stopping portion 1333 to respectively engage with the first engaging structure 1112 and the second engaging structure 1122.

In order to make structure simpler and more compact, in this embodiment, as shown in FIG. 2, FIG. 6, FIG. 7, FIG. 9 and FIG. 10, an extending direction of a pivoting axis of the driving component 132 and an extending direction of a pivoting axis of the driven component 133 can be substantially parallel to a normal direction N of the main body 131 and perpendicular to the first sliding direction S1, the second sliding direction S2 and a spacing direction D between the second lateral wall 112 and the first lateral wall 111. The driving portion 1321, the first pushing portion 1322 and the first stopping portion 1323 can be fixedly connected to one another integrally, i.e., the driving component 132 can be a one-piece structure formed integrally. The driven portion 1331, the second pushing portion 1332 and the second stopping portion 1333 can be fixedly connected to one another integrally, i.e., the driven component 133 can be a one-piece structure formed integrally. Each of the driving portion 1321 and the driven portion 1331 can include a plurality of engaging teeth. Each of the first pushing portion 1322, the first stopping portion 1323, the second pushing portion 1332 and the second stopping portion 1333 can be a protrusion. The first pushing structure 1111 and the second pushing structure 1121 can respectively be an abutting end of the first lateral wall 111 and an abutting end of the second lateral wall 112. The first engaging structure 1112 and the second engaging structure 1122 can respectively be an engaging slot formed on the first lateral wall 111 and an engaging slot formed on the second lateral wall 112. When the main body 131 is located at the installation position relative to the casing 11, the first pushing portion 1322 and the second pushing portion 1332 respectively abut against the abutting end of the first lateral wall 111 and the abutting end of the second lateral wall 112, and the first stopping portion 1323 and the second stopping portion 1333 respectively engage with the first engaging structure 1112 and the second engaging structure 1122 and respectively abut against a slot wall of the first engaging structure 1112 and a slot wall of the second engaging structure 1122. By abutment of the first pushing portion 1322 and the abutting end of the first lateral wall 111 and abutment of the second pushing portion 1332 and the abutting end of the second lateral wall 112, the main body 131 is restrained from slidably leaving from the installation position along the second sliding direction S2. By abutment of the first stopping portion 1323 and the slot wall of the first engaging structure 1112 and abutment of the second stopping portion 1333 and the slot wall of the second engaging structure 1122, the main body 131 is restrained from slidably leaving from the installation position along the first sliding direction S1.

However, the present invention is not limited to this embodiment. For example, in another embodiment, there can be two open slot structures respectively formed on the first lateral wall and the second lateral wall. Each of the open slot structures includes an open end and a closed end. The open end is configured to allow the first pushing portion or the second pushing portion to enter into the corresponding open slot structure. The closed end is configured to abut against the first pushing portion or the second pushing portion, i.e., the first pushing structure and the second pushing structure can respectively be the closed ends of the two open slot structures.

Besides, the ejecting mechanism 13 further includes an operating component 134 exposed out of the main body 131 and connected to the driving component 132. The operating component 134 is operated to drive the driving component 132 to switch from the first position to the second position for driving the first pushing portion 1322 and the second pushing portion 1332 to respectively push the first pushing structure 1111 and the second pushing structure 1121, so as to drive the main body 131 to slide from the installation position to the detachment position along the first sliding direction S1.

In this embodiment, the operating component 134 can be a structure independent from the driving component 132 and connected to the driving component 132 by a fastening component, such as a screw component. However, the present invention is not limited thereto. For example, in another embodiment, the operating component and the main body can be connected to each other integrally.

In addition, since the operating component 134 is operated to drive the main body 131 to slide from the installation position to the detachment position by overcoming a mating force between the electrical connector 121 and the electrical connector 1131, a moment arm L1 of the operating component 134 relative to a pivoting axis of the main body 131 can be greater than a moment arm L2 of the first pushing portion 1322 relative to the pivoting axis of the main body 131, so as to achieve the labor-saving operation of the operating component 134.

Moreover, the ejecting mechanism 13 further includes a resilient component 135 disposed between the driving component 132 and the main body 131 for driving the driving component 132 to switch to the second position. In other words, the resilient component 135 is forced to resiliently deform when the main body 131 and the driving component 132 are respectively located at the installation position and the first position. When the main body 131 and the driving component 132 are respectively located at the detachment position and the second position, the resilient component 135 is resiliently recovered. Therefore, the resilient component 135 can prevent the driving component 132 from accidentally switching to the first position after the ejecting mechanism 13 is detached or withdrawn from the casing 11, which prevents any interference between the first stopping portion 1323 of the driving component 132 located at the first position and the first pushing structure 1111 for ensuring the main body 131 to slide from the detachment position to the installation position smoothly when the ejecting mechanism 13 is slidably reinstalled on the casing 11.

Furthermore, understandably, in another embodiment, an ejecting mechanism can be utilized in a detachable device whose circuit board is a flexible circuit board, and the electrical connector of the detachable module can be configured to be connected to the electrical connector of the circuit board instead of being disconnected from the electrical connector of the circuit board during an ejecting process. Alternatively, in another embodiment, an ejecting mechanism can be used in a detachable device which does not include any electrical connector connected between the detachable module and the casing.

In contrast to the prior art, in the present invention, since the moment arm of the operating component relative to the pivoting axis of the driving component is greater than the moment arm of the first pushing portion relative to the pivoting axis of the driving component, the ejecting mechanism has labor-saving operation. Furthermore, in the present invention, since the ejecting mechanism pushes the first lateral wall and the second lateral wall of the casing respectively by the driving component and the driven component movably linked to each other for driving the main body to slide from the installation position to the detachment position, the ejecting mechanism can apply balanced forces on the casing, which prevents the electrical connector of the detachable module or the electrical connector of the circuit board from being damaged due to unbalanced forces when the detachable device is the electronic device. Besides, the present invention has simple structure and easy operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ejecting mechanism for a detachable module, the ejecting mechanism comprising: a main body slidably installed on a casing, the main body being slidably switchable between an installation position and a detachment position relative to the casing, the casing comprising a first lateral wall and a second lateral wall opposite to the first lateral wall, the main body comprising a first side and a second side opposite to the first side, the first side and the second side of the main body being respectively adjacent to the first lateral wall and the second lateral wall of the casing; a driving component pivotally connected to the main body and located at the first side of the main body, the driving component being pivotally switchable between a first position and a second position relative to the main body, the driving component comprising a driving portion; and a driven component pivotally connected to the main body and located at the second side of the main body, the driven component being pivotally switchable between a third position and a fourth position relative to the main body, the driven component comprising a driven portion, the driving portion being configured to cooperate with the driven portion, each of the driving portion and the driven portion comprising a plurality of engaging teeth, the driving component driving the driven component to switch from the third position to the fourth position by a cooperation of the engaging teeth of the driving portion and the driven portion when the driving component switches from the first position to the second position, and the driving component and the driven component respectively pushing the first lateral wall and the second lateral wall of the casing for driving the main body to slide from the installation position to the detachment position during a process that the driving component and the driven component switch from the first position and the third position to the second position and the fourth position respectively.

2. The ejecting mechanism of claim 1, wherein the driving component further comprises a first pushing portion, the driven component further comprises a second pushing portion, and the first pushing portion and the second pushing portion respectively push the first lateral wall and the second lateral wall of the casing for driving the main body to slide from the installation position to the detachment position along a first sliding direction during the process that the driving component and the driven component respectively switch from the first position and the third position to the second position and the fourth position.

3. The ejecting mechanism of claim 2, wherein the first pushing portion and the second pushing portion respectively abut against the first lateral wall and the second lateral wall of the casing to restrain the main body from slidably leaving from the installation position relative to the casing along a second sliding direction opposite to the first sliding direction when the driving component and the driven component are respectively located at the first position and the third position.

4. The ejecting mechanism of claim 3, wherein the driving component further comprises a first stopping portion, the driven component further comprises a second stopping portion, and the first stopping portion and the second stopping portion respectively engage with the first lateral wall and the second lateral wall of the casing to restrain the main body from sliding from the installation position to the detachment position relative to the casing when the driving component and the driven component are respectively located at the first position and the third position.

5. The ejecting mechanism of claim 1, wherein the driving component further comprises a first stopping portion, the driven component further comprises a second stopping portion, and the first stopping portion and the second stopping portion respectively engage with the first lateral wall and the second lateral wall of the casing to restrain the main body from sliding from the installation position to the detachment position relative to the casing when the driving component and the driven component are respectively located at the first position and the third position.

6. The ejecting mechanism of claim 1, wherein the driving component further comprises a first pushing portion, the driven component further comprises a second pushing portion, the first lateral wall and the second lateral wall of the casing respectively push the first pushing portion and the second pushing portion for driving the driving component and the driven component to respectively switch from the second position and the fourth position to the first position and the third position during a process that the main body slides from the detachment position to the installation position relative to the casing.

7. The ejecting mechanism of claim 6, wherein the driving component further comprises a first stopping portion, the driven component further comprises a second stopping portion, and the first lateral wall and the second lateral wall of the casing respectively push the first pushing portion and the second pushing portion for driving the driving component and the driven component to respectively switch from the second position and the fourth position to the first position and the third position to drive the first stopping portion and the second stopping portion to respectively engage with the first lateral wall and the second lateral wall during the process that the main body slides from the detachment position to the installation position relative to the casing.

8. The ejecting mechanism of claim 1, further comprising a resilient component disposed between the driving component and the main body for driving the main body to switch to the second position.

9. The ejecting mechanism of claim 1, further comprising an operating component exposed out of the main body and connected to the driving component, and the operating component driving the driving component to switch from the first position to the second position when the operating component is operated.

10. The ejecting mechanism of claim 9, wherein the driving component further comprises a first pushing portion, and a moment arm of the operating component relative to a pivoting axis of the driving component is greater than a moment arm of the first pushing portion relative to the pivoting axis of the driving component.

11. A detachable device comprising: a casing comprising at least one first lateral wall and at least one second lateral wall opposite to the at least one first lateral wall; a detachable module; and at least one ejecting mechanism comprising: a main body disposed on the detachable module and slidably installed on the casing, the main body being slidably switchable between an installation position and a detachment position relative to the casing, the main body comprising a first side and a second side opposite to the first side, the first side and the second side of the main body being respectively adjacent to the at least one first lateral wall and the at least one second lateral wall of the casing; a driving component pivotally connected to the main body and located at the first side of the main body, the driving component being pivotally switchable between a first position and a second position relative to the main body, the driving component comprising a driving portion; and a driven component pivotally connected to the main body and located at the second side of the main body, the driven component being pivotally switchable between a third position and a fourth position relative to the main body, the driven component comprising a driven portion, the driving portion being configured to cooperate with the driven portion, each of the driving portion and the driven portion comprising a plurality of engaging teeth, the driving component driving the driven component to switch from the third position to the fourth position by a cooperation of the engaging teeth of the driving portion and the driven portion when the driving component switches from the first position to the second position, and the driving component and the driven component respectively pushing the at least one first lateral wall and the at least one second lateral wall of the casing for driving the main body to slide from the installation position to the detachment position during a process that the driving component and the driven component switch from the first position and the third position to the second position and the fourth position respectively.

12. The detachable device of claim 11, wherein the driving component further comprises a first pushing portion, the driven component further comprises a second pushing portion, and the first pushing portion and the second pushing portion respectively push the at least one first lateral wall and the at least one second lateral wall of the casing for driving the main body to slide from the installation position to the detachment position along a first sliding direction during the process that the driving component and the driven component respectively switch from the first position and the third position to the second position and the fourth position.

13. The detachable device of claim 12, wherein the first pushing portion and the second pushing portion respectively abut against the at least one first lateral wall and the at least one second lateral wall of the casing to restrain the main body from slidably leaving from the installation position relative to the casing along a second sliding direction opposite to the first sliding direction when the driving component and the driven component are respectively located at the first position and the third position.

14. The detachable device of claim 13, wherein the driving component further comprises a first stopping portion, the driven component further comprises a second stopping portion, and the first stopping portion and the second stopping portion respectively engage with the at least one first lateral wall and the at least one second lateral wall of the casing to restrain the main body from sliding from the installation position to the detachment position relative to the casing when the driving component and the driven component are respectively located at the first position and the third position.

15. The detachable device of claim 11, wherein the driving component further comprises a first stopping portion, the driven component further comprises a second stopping portion, and the first stopping portion and the second stopping portion respectively engage with the at least one first lateral wall and the at least one second lateral wall of the casing to restrain the main body from sliding from the installation position to the detachment position relative to the casing when the driving component and the driven component are respectively located at the first position and the third position.

16. The detachable device of claim 11, wherein the driving component further comprises a first pushing portion, the driven component further comprises a second pushing portion, the at least one first lateral wall and the at least one second lateral wall of the casing respectively push the first pushing portion and the second pushing portion for driving the driving component and the driven component to respectively switch from the second position and the fourth position to the first position and the third position during a process that the main body slides from the detachment position to the installation position relative to the casing.

17. The detachable device of claim 16, wherein the driving component further comprises a first stopping portion, the driven component further comprises a second stopping portion, and the at least one first lateral wall and the at least one second lateral wall of the casing respectively push the first pushing portion and the second pushing portion for driving the driving component and the driven component to respectively switch from the second position and the fourth position to the first position and the third position to drive the first stopping portion and the second stopping portion to respectively engage with the at least one first lateral wall and the at least one second lateral wall during the process that the main body slides from the detachment position to the installation position relative to the casing.

18. The detachable device of claim 17, wherein a first pushing structure and a first engaging structure are formed on the at least one first lateral wall, a second pushing structure and a second engaging structure are formed on the at least one second lateral wall, and the first pushing structure and the second pushing structure respectively push the first pushing portion and the second pushing portion for driving the driving component and the driven component to respectively switch from the second position and the fourth position to the first position and the third position to drive the first stopping portion and the second stopping portion to respectively engage with the first engaging structure and the second engaging structure during the process that the main body slides from the detachment position to the installation position relative to the casing.

19. The detachable device of claim 11, wherein the ejecting mechanism further comprises a resilient component disposed between the driving component and the main body for driving the main body to switch to the second position.

20. The detachable device of claim 11, wherein the ejecting mechanism further comprises an operating component exposed out of the main body and connected to the driving component, and the operating component driving the driving component to switch from the first position to the second position when the operating component is operated.

21. The detachable device of claim 20, wherein the driving component further comprises a first pushing portion, and a moment arm of the operating component relative to a pivoting axis of the driving component is greater than a moment arm of the first pushing portion relative to the pivoting axis of the driving component.

* * * * *